United States Patent [19]

Bertellotti et al.

[11] 4,377,907

[45] Mar. 29, 1983

[54] TOOL FOR INSERTING PRINTED CIRCUIT CARDS

[75] Inventors: Ansano Bertellotti, Addison; Arvo Taliste, Downers Grove, both of Ill.

[73] Assignee: GTE Automatic Electric Labs Inc., Northlake, Ill.

[21] Appl. No.: 274,903

[22] Filed: Jun. 18, 1981

[51] Int. Cl.³ .............................................. H05K 3/36
[52] U.S. Cl. ...................................... 29/747; 29/267; 29/758; 294/15
[58] Field of Search ................. 29/764, 762, 758, 747, 29/267, 268, 278; 294/15

[56] References Cited

U.S. PATENT DOCUMENTS

| | | | |
|---|---|---|---|
| 2,691,506 | 10/1954 | Wilson | 29/267 X |
| 3,617,083 | 11/1971 | Koppensteiner et al. | 294/15 |
| 3,903,576 | 10/1974 | Stein | 29/764 |
| 4,109,379 | 8/1978 | Ratti et al. | 29/747 |

Primary Examiner—Carl E. Hall
Attorney, Agent, or Firm—Robert J. Black; Anthony Miologos

[57] ABSTRACT

A tool for inserting a printed circuit card into a holder the latter having top and bottom tracks and a rear wall having contacts engageable by terminal tabs on the card, comprising a pistol grip type handle and a shaft extending perpendicularly outward from the handle. The shaft includes a hook on one end with an opposite end mounted to the handle. A plunger is slideably mounted on the shaft and is propelled forward via a spring loaded trigger bracket. With the hook engaged to the bottom guide track the plunger is used to push and insert the card into the holder when the trigger bracket is squeezed.

5 Claims, 3 Drawing Figures

TOOL FOR INSERTING PRINTED CIRCUIT CARDS

BACKGROUND OF THE INVENTION (1) Field of the Invention

The present invention relates to a tool designed to facilitate the insertion of a printed circuit card into a holder.

(2) Description of the Prior Art

Today, printed circuit cards are frequently assembled in a holder rack having the shape of an open topped box whose side walls form tracks for the guidance of cards sent to and out of their assembled position. Terminal tabs on a base strip or block of each card fit into a socket having co-acting contacts to complete a connection to an external circuit. In practice, the track forming side walls may be horizontally disposed, with the contact bearing sockets arranged on the upright rear wall.

The placement of such printed circuit cards in their holder is a somewhat delicate operation since in the last phase of insertion an additional thrust must be exerted in order to interfit the co-acting connector pairs. In view of the great frictional resistance, attempts to insert a card with bare hands may cause injury to the operator whose fingers could be cut by the exposed front edges of the card when applying pressure thereto. It is also important to hold the card properly aligned with its guide channels in order to avoid bending stresses which could damage the printed circuits. These basic problems are perceptively increased as the printed circuit cards become larger which substantially increase the insertion force required to properly seat the cards.

Accordingly, a tool is usually required to properly seat these cards. The tool must be compact, simple to operate and human engineered to be comfortably operated by either hand. Many cards presently on the market have insertion mechanisms built on the printed circuit cards. This approach increases the individual card cost and therefore a separate tool is a more economical approach to the card insertion requirement.

It therefore becomes an object of the present invention to provide an improved tool of the character described which facilitates the insertion of such printed circuit cards.

SUMMARY OF THE INVENTION

The tool according to our invention comprises a pistol grip type handle including a shaft extending perpendicularly outward from the handle. The shaft terminates in a hooked or curved paw which is oriented in a downwardly direction. The plunger is slideably mounted via a central bore about the shaft and arranged to slide along the shaft. A front face of the plunger includes a groove disposed to rest against a circuit card front edge. The assembly is completed by a spring loaded trigger bracket which when compressed by the operator's hand transfers the manual force to the plunger pushing the plunger forward.

The tool has been designed to work with holders of the type having an open card cage construction. The holders should have at least top and bottom front card guides oriented in a horizontal direction. The card guides also include transverse slots which accept lateral edges of the printed circuit card. The slots hold and guide the card to the connector found in the rear of the holder. With this in mind, the operation of the tool will be explained.

To use the tool to insert a circuit card a card which includes a handle on a front edge is first inserted by hand into the holder until it reaches the connector entrance. At this point the tool is applied by inserting the hook into the card holder area between the bottom of the card handle and the card guide. The hook is then engaged behind the front card guide and the plunger is nested on the printed circuit card edge below the card handle. The free hand is then placed on top of the card handle to stabilize the board during insertion and the trigger squeezed which moves the plunger forward inserting the card into the connector.

DESCRIPTION OF THE DRAWINGS

The above and other features of our invention will now be described in detail with reference to the accompanying drawings in which:

FIG. 1A is a front elevational face view of the plunger;

DESCRIPTION OF THE PREFERRED EMBODIMENT

Figure 1:
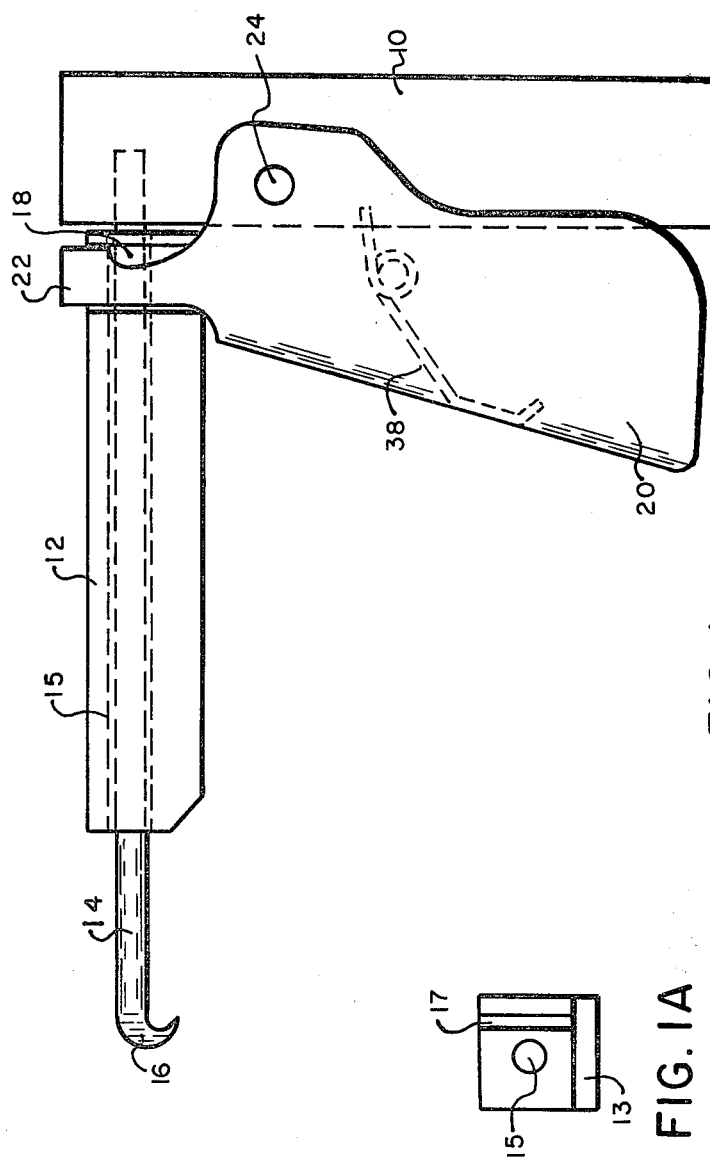
FIG. 1 is a side elevational view of the present invention.

Turning now to the included drawings FIG. 1 illustrates the tool of the present invention. The tool includes a rectangular handle 10 having a shaft 14 extending outward perpendicular to the handle from a top portion thereof. Shaft 14 terminates and is rigidly mounted at handle 10 on a rear end and at a downward oriented hook or paw 16 on an opposite end. A plunger 12 is slideably mounted over shaft 14 via a central bore 15. Plunger 12 further includes a notched recess 18 on a left side thereof. As can be seen on FIG. 1A the plunger 12 further includes a circuit card nesting notch 17 on a front face of plunger 12. Notch 17 nests the front edge of a circuit card when the tool is used to insert a circuit card into the holder. The assembly is completed by a trigger bracket 20 which is pivotally mounted to the handle 10 via a pin 24. Trigger bracket 20 also includes an upper lever 22. Lever 22 is housed within notch 18. A spring 38 biases the trigger bracket 20 outward.

The tool is intended to be used in circuit card housings of the type which have at least top and bottom horizontal card guides found on the front of the housing. These card guides also include transverse slots which are arranged to receive opposite edges of the circuit card. The slots hold and guide the card to associated connectors which are vertically oriented at the back of the holder. Further, the circuit cards also include a handle on a front edge in order to be easier to grasp when inserting the card into the holder.

With this in mind an explanation of the insertion of a circuit card employing the tool of the present invention will now be described in detail.

Figure 2:
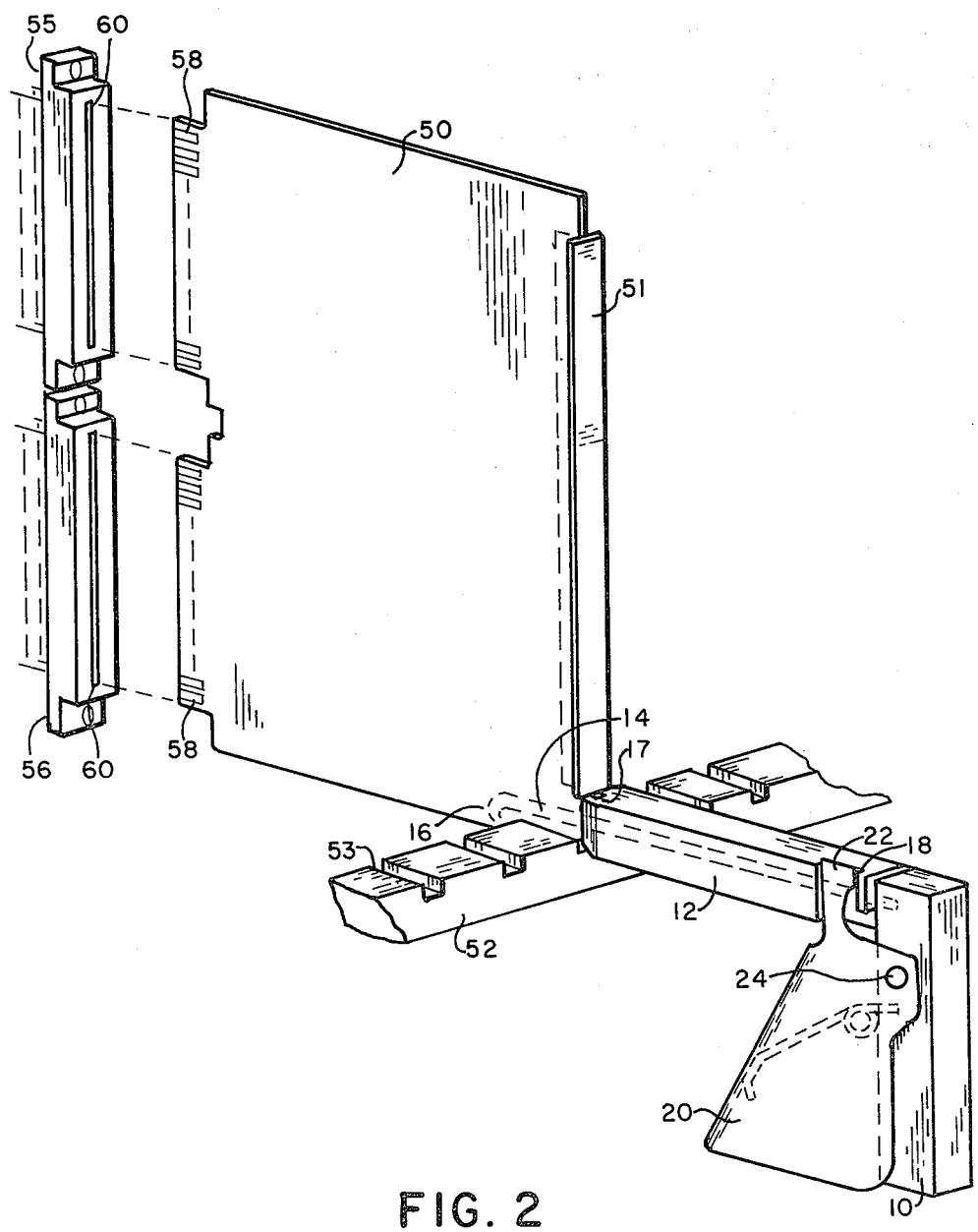
FIG. 2 is a perspective view showing the tool of the present invention used to insert a circuit card.

Turning now to FIG. 2 it can be seen that a circuit card 50 is placed on a horizontal card guide 52 having transverse slot 53 which leads to a pair of connectors 55 and 56. Connectors 55, 56 each include a slot 60 arranged to accept a rear edge of the circuit card and engage pads 58. The top card guide has been eliminated from the drawing as well as other card holder structures for ease of explanation. The circuit card 50 is first positioned within the holder between two opposite top and bottom card guide slots and inserted by hand until it reaches the connector entrance. At this point the tool is grasped in either hand and the curved hook inserted into the card holder area between the bottom of the card handle 51 and the card guide 52. The hook is then engaged behind the front card guide 52. Plunger groove 17 is nested along the front edge of circuit card 50 below the handle 51. A free hand is then placed on the top of the card handle so as to stabilize the circuit card and the trigger is actuated by compressing trigger 20. Lever 22 is forced forward transmitting the force applied to trigger 20 to the plunger via notch 18. The plunger thus moves forward along shaft 14 transmitting the force to the circuit card, propelling the circuit card forward and inserting the rear edge of the circuit card within slots 60 of the connectors. Upon release of trigger 20 the now compressed spring 38 throws the trigger bracket forward which moves lever 22 backward, returning plunger 12 to its original position. The tool can then be lifted out and removed from the card guide.

The tool of the present invention has advantages in ease operation, portability, and universal usage. It can also be appreciated by those skilled in the art that the tool may be used with cards of different sizes and shapes.

The present invention has been described with reference to a specific embodiment thereof, for the purpose of illustrating the manner in which the invention may be used to advantage, and will be appreciated by those skilled in the art that the invention is not limited thereto. Accordingly, any and all modifications, variations or equivalent arrangements which may occur to those skilled in the art should be considered to be within the scope of the invention.

What is claim is:

1. A manipulator for facilitating the insertion of a printed circuit card into a holder, the latter having top and bottom parallel card guides, each card guide including at least one transversely oriented guide track having respective lateral card edges resting therein, said manipulator comprising:

a first member having a shaft projecting outwardly perpendicular to said first member and said shaft terminating in an hooked end, said hooked end arranged to engage said bottom card guide adjacent said circuit card;

plunger means slideably mounted to said shaft and moveable along said shaft, including a front face arranged to rest against a transverse edge of said circuit card;

lever means rotatably mounted to said first member and including first and second sections, said first section in communication with said plunger means and said second section disposed to have manual pressure applied thereto urging said second section toward said first member and said first section in response to said pressure moving said plunger away from said first member thereby applying a force to said circuit card and inserting said card into said holder.

2. A manipulator as defined in claim 1, wherein: said first member is comprised of a rectangular handle having a square cross section and having said shaft extending outwardly perpendicular from one face of the upper portion of said handle and said shaft hooked end extending downwardly.

3. A manipulator as defined in claim 1, wherein: said plunger is rectangularly shaped including a longitudinal bore running through said plunger arranged to accept said shaft therein allowing said plunger to be moveable along said shaft, said plunger further including a vertically oriented notch on one face thereof adjacent said handle arranged to accept said lever means first section therein.

4. A manipulator as defined in claim 1, wherein: said lever means second section is comprised of a triangularly shaped trigger said trigger rotatably mounted to two opposite faces of said handle and having a vertical upstanding leg extending from said trigger forming said lever means first section, said trigger including a wire spring biasing said trigger away from said handle.

5. A manipulator as defined in claim 1, wherein: said plunger front face includes a vertically oriented channel situated off center on said front face and arranged to receive an edge of said circuit card therein.

* * * * *